United States Patent
Boppel et al.

(10) Patent No.: US 9,508,764 B2
(45) Date of Patent: Nov. 29, 2016

(54) MONOLITHICALLY INTEGRATED ANTENNA AND RECEIVER CIRCUIT

(75) Inventors: Sebastian Boppel, Frankfurt (DE); Alvydas Lisauskas, Frankfurt (DE); Hartmut Roskos, Kronberg (DE); Viktor Krozer, Frankfurt (DE)

(73) Assignee: Johann Wolfgang Goethe-Universitat Frankfurt a. M., Frankfurt am Main (DE)

( * ) Notice: Subject to any disclaimer, the term of this patent is extended or adjusted under 35 U.S.C. 154(b) by 0 days.

(21) Appl. No.: 14/122,897

(22) PCT Filed: May 31, 2012

(86) PCT No.: PCT/EP2012/060304
§ 371 (c)(1),
(2), (4) Date: Nov. 27, 2013

(87) PCT Pub. No.: WO2012/164040
PCT Pub. Date: Dec. 6, 2012

(65) Prior Publication Data
US 2014/0091376 A1    Apr. 3, 2014

(30) Foreign Application Priority Data
May 31, 2011    (DE) .................. 10 2011 076 840

(51) Int. Cl.
*H01L 27/146* (2006.01)
*H01L 31/101* (2006.01)
*H01L 31/112* (2006.01)

(52) U.S. Cl.
CPC ....... *H01L 27/14601* (2013.01); *H01L 31/101* (2013.01); *H01L 31/112* (2013.01)

(58) Field of Classification Search
CPC ............................................ H01L 27/14601
USPC ............... 257/291, 290, 187, 194, E31.079, 257/E31.076
See application file for complete search history.

(56) References Cited

U.S. PATENT DOCUMENTS 4,647,848 A * 3/1987 Barrett ........................... 324/95
5,818,283 A * 10/1998 Tonami et al. ................ 327/436
(Continued)

FOREIGN PATENT DOCUMENTS

DE   10 2007 062 562 A1   7/2009
DE   10 2008 047 103 A1   3/2010
(Continued)

OTHER PUBLICATIONS

Michael Dyakonov and Michael Shur, "Shallow Water Analogy for a Ballastic Field Effect Transistor", vol. 17, No. 15, Published—Oct. 11, 1993, pp. 2465-2469. Relevanse is that ot was cited on p. 7 of the instant application.

*Primary Examiner* — Sheng Zhu
(74) *Attorney, Agent, or Firm* — Paul & Paul

(57) ABSTRACT

The invention relates to a device for detecting electromagnetic radiation in the THz frequency range, comprising at least one transistor (FET1, FET2), which has a first electrode, a second electrode, a control electrode, and a channel between the first electrode and the second electrode, and comprising an antenna structure. An electrode is connected to the antenna structure such that an electromagnetic signal which lies in the THz-frequency range and which is received by the antenna structure (1) can be fed into the channel between electrodes and the control electrode is connected to an electrode via a capacitor and/or the control electrode and the first electrode or the control electrode and the second electrode have an intrinsic capacitor such that no AC voltage drop occurs between the control electrode and the first electrode or the second electrode.

30 Claims, 10 Drawing Sheets

(56) References Cited

U.S. PATENT DOCUMENTS

| | | | |
|---|---|---|---|
| 6,683,471 B2* | 1/2004 | Ratni et al. | 324/132 |
| 6,741,205 B2* | 5/2004 | Nagasaku | 342/174 |
| 7,638,817 B2* | 12/2009 | Shur et al. | 257/187 |
| 2006/0081889 A1 | 4/2006 | Shur et al. | |
| 2011/0001173 A1* | 1/2011 | Ojefors et al. | 257/290 |

FOREIGN PATENT DOCUMENTS

| | | |
|---|---|---|
| DE | 10 2009 029 447 A1 | 3/2011 |
| DE | 10 2010 028 987 A1 | 11/2011 |
| JP | 2011-509518 A | 3/2011 |
| WO | 03044941 A1 | 5/2003 |
| WO | 2010028972 A1 | 3/2010 |

* cited by examiner

MONOLITHICALLY INTEGRATED ANTENNA AND RECEIVER CIRCUIT

The present invention relates to a device for detecting electromagnetic radiation in the THz frequency range, with at least one transistor, which has a first electrode, a second electrode, a control electrode and a channel between the first and the second electrode, and with an antenna structure.

The terahertz frequency range or submillimeter wavelength range, which is roughly defined as being between 100 GHz and 30 THz, is one of the last "dark" areas in the electromagnetic spectrum. In this frequency range, hitherto, technically usable, in particular coherent, sources and corresponding detectors have not been commercially available or have only been commercially available at low frequencies. Developments in recent decades have resulted in complicated systems which, by virtue of their complexity, however, have hitherto only been used in particularly experimental areas such as radio astronomy or atmospheric research. Hitherto, no inexpensive sources and detectors have been available for applications in everyday life, even though the THz frequency range has intrinsic advantages over other frequency bands in the electromagnetic spectrum:

- many optically opaque materials are transparent in the THz frequency range.
- THz radiation is non-ionizing and is therefore deemed to be safe in the biomedical field.
- certain rotatory, vibronic or libratory molecular excitations have a resonant frequency in the THz frequency range.
- THz radiation provides essential items of information about charge carrier dynamics, in particular in nanostructures, which play an essential role in future photonic and electronic components.
- THz radiation exhibits a lesser degree of scatter than optical frequencies and is therefore suitable in particular for use in industrial environments in which, for example, there is a high level of dust formation.
- where communications systems are concerned, higher frequencies make greater transmission bandwidths possible.

The majority of purely electronic devices operating in the THz range are based on GaAs or InP semiconductor technology. It has recently been demonstrated that SiGe and CMOS semiconductor technologies also result in devices operating up to one THz and above.

Terahertz radiation is currently detected with heterodyne mixers, for example Schottky mixers, photoconductive detectors or power detectors, such as, for example, photovoltaic detectors, bolometers or Golay cells.

However, all the techniques described above involve considerable complexity with respect to the source and detector components themselves and the manufacture thereof, with the result that, although they are used in the field of research and development and in research-related fields of use, such as radio astronomy, they are not yet suitable for mass markets.

U.S. Pat. No. 4,647,848 discloses a field effect transistor circuit that is used to detect the power level of a radio frequency signal. The receiver circuit described is made up of discrete elements, with the result that it does not enable high integration densities on a chip. In addition, by virtue of its long time constant, which is determined by the transit times of the charge carriers through the field effect transistor, it is not suitable for high frequencies in the THz frequency range. The receiver circuit described in the aforementioned US patent uses a field effect transistor as so-called resistive mixer. To this end, the radio frequency signal is coupled into the drain of the field effect transistor and the gate of the field effect transistor is biased with a DC voltage, wherein the output signal is filtered with a low-pass filter, with the result that the signal strength of the resulting direct current behind the low-pass filter is proportional to the power of the radio frequency signal. Circuitry arrangements which enable mixing of the signal to be received with a local oscillator are not described.

DE10 2007 062 562 B4 describes how an electromagnetic signal in the THz frequency range received by an antenna structure is fed via the gate-source contact into a field effect transistor. In order to be able to provide efficient detection with this kind of feed-in of the THz signal, (external or intrinsic) capacitive coupling is furthermore provided between the gate and the drain.

Vis-à-vis this state of the art, the object of the present invention is to provide a device for detecting electromagnetic radiation in the THz frequency range with an increased flexibility in the circuit design and an improved robustness.

To this end, according to the invention, a device is proposed for detecting electromagnetic radiation in the THz frequency range, with at least one transistor, which has a first electrode, a second electrode, a control electrode and a channel between the first electrode and the second electrode, and with an antenna structure, wherein the first electrode or the second electrode of the transistor is connected in an electrically conductive manner to the antenna structure such that an electromagnetic signal in the THz frequency range received by the antenna structure can be fed into the channel between the first electrode and the second electrode of the transistor, and the control electrode is connected via an external capacitance to the first electrode or the second electrode and/or the control electrode and the first electrode or the control electrode and the second electrode have an intrinsic capacitance such that no AC voltage drop occurs between the control electrode and the first electrode or the second electrode.

Within the meaning of the present application, by a transistor is meant a component with at least three electrodes, wherein here the term electrode is used synonymously with contact. One of the three electrodes is a control electrode, wherein a current or voltage signal applied to the control electrode switches a flow of current between the two further electrodes. For linguistic simplification, in the present application, the at least two further electrodes in addition to the control electrode are referred to as the first and second electrode. In particular, embodiments are also conceivable in which the transistor has more than three electrodes, in particular a plurality of control electrodes, for example as a multigate transistor.

A bipolar transistor, a field effect transistor or even a new type of transistor, such as an organic-based transistor or a transistor based on carbon nano-tubes, is particularly suitable as transistor for implementing embodiments of the present invention.

In a first embodiment, the arrangement according to the invention can be implemented with a bipolar transistor, which has an emitter as first electrode, a collector as second electrode, a base as control electrode, a base-collector contact, a collector-emitter path as channel between the first electrode and the second electrode and a base-emitter contact. In this case, the emitter electrode or the collector electrode are optionally connected to the antenna structure such that the received electromagnetic signal in the THz frequency range is coupled into the collector-emitter path.

In an alternative embodiment, the transistor is a field effect transistor (FET), which has a drain as first electrode, a source as second electrode, a gate as control electrode, a gate-source contact, a source-drain channel as channel between the first electrode and the second electrode and a gate-drain contact. In this case, the drain or the source are alternatively connected to the antenna structure such that the received electromagnetic signal in the THz frequency range is coupled into the source-drain channel.

Vis-à-vis a known coupling of the THz signal into the transistor via the contact between the control electrode and either the first or the second electrode, the device according to the invention has the advantage that it makes it possible to minimize the losses of the THz signal between the antenna and the transistor, since a coupling-in of the THz signal via the channel between the first and the second electrode implements the shortest possible distance between the antenna and the transistor.

In addition, the arrangement according to the invention makes it possible to use the antenna as a low-pass filter, with the result that no additional transmission lines or other elements are necessary.

The electrically conductive connection of the antenna structure to the first or second electrode according to the invention also has the advantage during the manufacture of the corresponding semiconductor elements that no additional elements, such as, for example, protective diodes, have to be provided in order to prevent a build-up of charge during the production process. Protective diodes of this kind limit the maximum modulation or operating frequency of the components.

In one embodiment, the coupling of the antenna to the first or second electrode of the device makes it possible to dispense with transmission lines between the antenna and the transistor, with the result that lower transmission losses occur between the antenna and the transistor. In addition, the decoupling from the antenna is subject to fewer losses. In addition, dispensing with transmission lines between the antenna and the transistor also has the result that fewer discontinuities occur between the antenna and the transistor, whereby undesired radiation and reflections, and thus losses, are further minimized.

The electric lines between the antenna and the transistor can also be designed to function as a coil and can be used for the impedance matching of the antenna-transistor arrangement.

Within the meaning of the present use, by the THz frequency range is meant a frequency range of between 100 GHz and 30 THz.

For the device according to the invention for detecting electromagnetic radiation in the THz frequency range, the transistor is to be considered to be a high-frequency component, i.e. high-frequency electromagnetic signals have to be fed into the field effect transistor and optionally read out from this.

In one embodiment, the high-frequency signal is coupled in via a two-wire line to two electrodes of the transistor with which the two-wire line can be connected.

Correspondingly, according to the invention, the coupling of the signals in the wave pattern is not into a single electrode of the transistor but via a terminal consisting of two electrodes. Therefore, reference is made to a feed into the channel between the first and the second electrode, for example the source-drain channel (field effect transistor) or the collector-emitter path (bipolar transistor).

In one embodiment, the integration or arrangement of the transistor and the antenna structure together on a single substrate enables a high integration density in the case of the combination of a plurality of devices according to the invention to form a line-type or two-dimensional detector. In addition, due to the short non-existent distances between the antenna structure and the transistor, the integration of the transistor and the antenna structure on a single substrate makes it possible to avoid transport losses, which would otherwise inevitably occur during the transmission of the THz signal received by the antenna structure to the transistor.

However, the integration of the antenna structure and the transistor on a single substrate requires a new concept of the whole device taking into account the interactions that occur between the two elements due to the spatial proximity of the antenna structure and the transistor, as described in more detail below.

In one embodiment, the transistor and the antenna structure are integrated monolithically on a single chip, i.e. on a single piece of a semiconductor material, for example made of silicon.

In one embodiment, the antenna structure has a terminal which is connected directly to the first or the second electrode. In this way, direct coupling of the THz radiation into the transistor is made possible without high transport losses. In addition, in particular embodiments there is less risk of a breakdown of the gate insulating layer if the transistor is a field effect transistor.

In one embodiment, the transistor is a metal-insulator-semiconductor field effect transistor (MISFET), in particular a metal-oxide-semiconductor field effect transistor (MOSFET).

In one embodiment of the invention, the transistor is a so-called plasma field effect transistor. US patent application 2006/0081889 A1 and the technical article by M. Dyakonov and M. Shur "Shallow Water Analogy for a Ballistic Field Effect Transistor: New Mechanism of Plasma Wave Generation by dc Current", Applied Physics Letters, Volume 71, No. 15, pages 2465-2468, October 1993, and M. Dyakonov and M. Shur, "Plasma Wave Electronics: Novel Devices using Two Dimensional Electron Fluid", IEEE Transactions on Electron Devices, Volume 43, No. 10, October 1996 disclose metal-oxide-semiconductor field effect transistors (MOSFETs), which can be produced by means of inexpensive semiconductor structuring methods such as, for example, CMOS or bipolar SiGe technologies in order to implement receiver circuits for operation at THz frequencies.

If an electromagnetic wave is coupled into the channel of an FET, a constant source-drain voltage is induced. In a channel with high charge carrier mobility, this constant source-drain voltage has a resonant dependency on the frequency of the irradiated electromagnetic radiation. If the mixing in the field effect transistor is attributable to the so-called Dyakonov-Shur effects, the resonant frequency is proportional to the root of the surface charge carrier density and inversely proportional to the gate length. With the gate lengths and carrier densities achievable by modern semiconductor process technologies, it is possible for the plasma frequency of the plasma field effect transistors to reach the THz frequency range. However, the mixing in a field effect transistor can also be caused by other physical effects, such as, for example, local plasmons, hot-electron gas (non-homogeneous carrier heating) and further non-linearities.

The named effects all have the advantage that they also occur above the cut-off frequency determined by the charge carrier transit time of the transistors, with the result that mixing can also take place effectively above the cut-off frequency of the components.

The plasma field effect transistors can operate under two different operating conditions. First, there is a resonant ballistic mode of operation, which can be obtained in devices with a short channel. On the other hand, devices with a long channel can be operated in an overdamped mode of operation. While, in the overdamped mode of operation, the detector response is a flat function of the frequency of the irradiated electromagnetic radiation, with the result that this mode of operation is suitable in particular for wide-band detectors, the ballistic mode of operation leads to structures which are resonant to a high degree.

In one embodiment, a plasma field effect transistor can be realized in that the gate-source contact has a high-frequency short circuit for the plasma wave which is propagated in the channel.

Moreover, in one embodiment, a field effect transistor additionally complies with a second boundary condition, that it has an open drain for the plasma wave. This boundary condition for the plasma wave in the transistor is implemented in one embodiment by a high impedance at the THz target frequency at the source-drain channel. Alternatively or additionally, this terminating impedance of the source-drain channel can be provided intrinsically, i.e. in the transistor, for example by a semiconductor-metal junction.

In a further embodiment, a capacitance is provided between the control electrode and the first electrode or between the control electrode and the second electrode, with the result that the voltage at the gate follows the voltage at the drain or the voltage at the source, wherein the control electrode and the first electrode or the control electrode and the second electrode have the same AC potential and there is no AC voltage drop between the control electrode and the first or second electrode.

The capacitance between the control electrode and the first electrode or between the control electrode and the second electrode can be an external capacitance, for example a capacitor, which is connected to the control electrode and the first electrode or the second electrode. Alternatively or additionally, the control electrode and the first electrode or the control electrode and the second electrode can have an intrinsic capacitance.

Intrinsic capacitances between the control electrode and the first or second electrode can be realized by two physical effects which can be distinguished from one another: a capacitance is formed between the electrodes or contacts themselves or in the channel between the electrodes by wave attenuation.

In one embodiment, the capacitance between the control electrode and the first electrode or between the control electrode and the second electrode, i.e. either the external or the intrinsic capacitance or a combination thereof, is greater than 0.1 fF.

In one embodiment, the intrinsic capacitance between the control electrode and the first electrode or between the control electrode and the second electrode is increased in that the control electrode and the first electrode or the control electrode and the second electrode are arranged above or beneath one another in such a way that they overlap one another spatially. In this way, due to the insulation between the electrodes, a plate capacitor is provided, the capacitance of which depends on the spatial overlap of the electrodes.

In one embodiment of the invention, the first electrode or the second electrode of the transistor is connected in an electrically conductive manner to an impedance matching element, preferably a waveguide, wherein this impedance matching element is arranged between the antenna structure and the transistor. An impedance matching element of this kind makes it possible to adjust the impedance of the first electrode or the second electrode and thus to ensure a better signal feed-in.

In one embodiment of the invention, the device has two transistors, preferably two field effect transistors.

These are expediently arranged in parallel, wherein the first or second electrodes of the two transistors are connected to one another in an electrically conductive manner.

In addition, the first or second electrode can be connected to an AC ground in order to improve the coupling of the electromagnetic wave in the THz frequency range into the channel between the first electrode and the second electrode or to comply with the short-circuit boundary condition for the plasma wave in a transistor operated as a plasma field effect transistor. The AC ground connected to the first or second electrodes can also serve as a bias voltage for a subsequent amplifier stage.

In one embodiment, the antenna structure has two terminals, which are each connected to the first electrode or the second electrode of one of the two transistors, such that the transistors are driven differentially by the electromagnetic wave received by the antenna structure. In one embodiment, for this differential operation, the first and second electrodes and the control electrodes of the two transistors are connected to one another.

In alternative embodiments, the antenna structure is a monopole antenna.

In addition, one embodiment of the transistor is expediently shielded by a ground plane.

In one embodiment of the invention, the antenna structure is a folded dipole antenna. This both has a point at which the AC voltage induced in relation to a ground plane is zero but it also makes the reception of two perpendicular resonant modes at the same frequency possible.

Possible alternative antenna structures suitable for the device according to the invention are patch antennas, ring antennas, slot antennas or notch antennas. If present, the ground plane is expediently arranged at a distance from the antenna structure, for example separated therefrom in an electrically insulating manner by an oxide layer.

In one embodiment of the invention, the first electrode or the second electrode of the transistor is connected both in an electrically conductive manner to the antenna structure and in an electrically conductive manner to a further terminal for the feeding-in or reading-out of a further signal. In this way, an electromagnetic signal in the THz frequency range received by the antenna structure can be fed into the channel between the first electrode and the second electrode of the transistor and also, via the further terminal, an output signal of the transistor can be picked off and/or a further signal can be fed into the channel between the first electrode and the second electrode of the transistor.

In one embodiment, symmetrical antenna structures, in particular folded dipole antennas, make it possible to connect the further terminal to a point of symmetry of the antenna structure or to a point on the antenna structure that lies on an axis of symmetry of the antenna structure. This connection of the further terminal to the antenna structure can then be used to read out the output signal of the transistor or to feed a further signal into the transistor.

Resonant antenna structures have a virtual ground at which a THz wave on the antenna structure has a temporally invariant node. At this point, therefore, the antenna structure appears with zero voltage or zero current with respect to the THz signal. If the output signal of the field effect transistor or transistors is fed into the antenna structure, the signal can be picked off at the virtual ground. Due to its resonance for the THz radiation to be detected, the antenna acts as a low-pass filter.

Suitable as a virtual ground are in particular those points on an antenna structure that lie in a point of symmetry of the antenna structure or on an axis of symmetry of the antenna structure, because points characterized in this way have exactly the same distance from the terminals of two field effect transistors.

The ground of the antenna structure can be used just as well as a feeding point for a further signal, preferably a calibration signal, as for reading out the output signal of the transistor.

The coupling of the electromagnetic THz signal via the antenna structure into the source-drain channel of the transistor according to the invention, i.e. a direct galvanic connection of the antenna structure to the drain or the source of the transistor, enables the above-described decoupling of the output signal of the field effect transistor or transistors from the circuit, which increases the integration density.

In addition, in one embodiment, the coupling according to the invention of the electromagnetic THz signal to be detected via the antenna structure into the source-drain channel of the transistor makes it possible to feed a calibration signal into the detector circuit likewise via the source-drain channel. In this way, the detector circuit can be easily calibrated. In order to feed a calibration signal into the detector circuit, in one embodiment, the first electrode or the second electrode, i.e. the source or the drain of the transistor, is connected both in an electrically conductive manner to the antenna structure and in an electrically conductive manner to a further terminal in order to feed in a further signal, preferably a calibration signal.

In one embodiment of the invention, therefore, the further terminal is connected to a calibration source to generate a calibration signal. The calibration source can be used to generate an electromagnetic signal with a defined power, preferably also with the THz frequency to be detected, and feed it into the detector device via the antenna structure.

The response behaviour of the detector circuit can then be measured as an output signal of the field effect transistors. In particular, it makes it possible to feed a defined electromagnetic calibration signal into the detector circuit
- to gather detector and mixing performance data (for example responsivity, NEP, modulation bandwidth, conversion, noise figure, detector or mixer saturation). Here, knowledge of the relationship of the detector responses in the different frequency ranges and different operating modes can be used;
- to determine an optimized detector operating point;
- to detect and monitor a change in properties of the detector;
- also to calibrate large-area detector arrays.

In one embodiment of the invention, the further terminal is connected to a bias tee. The bias tee in turn, on the one hand, provides an output terminal for picking off the output signal of the field effect transistors and, on the other, can be connected to a calibration source. In this way, it is possible for both a calibration signal to be fed into the detector circuit and the output signal of the circuit to be picked off via the further terminal of the first or second electrode (source or drain) of the transistor.

In order to enable a high integration density of a plurality of devices according to the invention on a single substrate, it is expedient for the amplifier circuit, in particular a differential amplifier, to be integrated on the same substrate as the antenna structure and the transistor.

In one embodiment of the device according to the invention, the signal to be detected can be read out with a suitable measuring apparatus with high impedance as a voltage. Alternatively, in one embodiment, the signal to be detected can be read out with a measuring device with low impedance as a current.

In addition, in one embodiment of the device according to the invention, further circuits, which are used for the operation of the device, are integrated on the substrate. These can be, for example, a bias voltage circuit, a detector circuit, which is preferably connected downstream of the amplifier circuit, a mixer circuit or a high-frequency source as a local oscillator.

Different embodiments of the above-described device for detecting electromagnetic radiation in the THz frequency range are suitable in particular for the implementation of a THz heterodyne receiver which mixes the electromagnetic signal to be received with a local oscillator. A THz heterodyne receiver of this kind is suitable in particular for use in an imaging system, in a radar system or a communications system.

Further advantages, features and possible uses of the present invention will be apparent from the present description of an embodiment and the associated figure.

Figure 1:
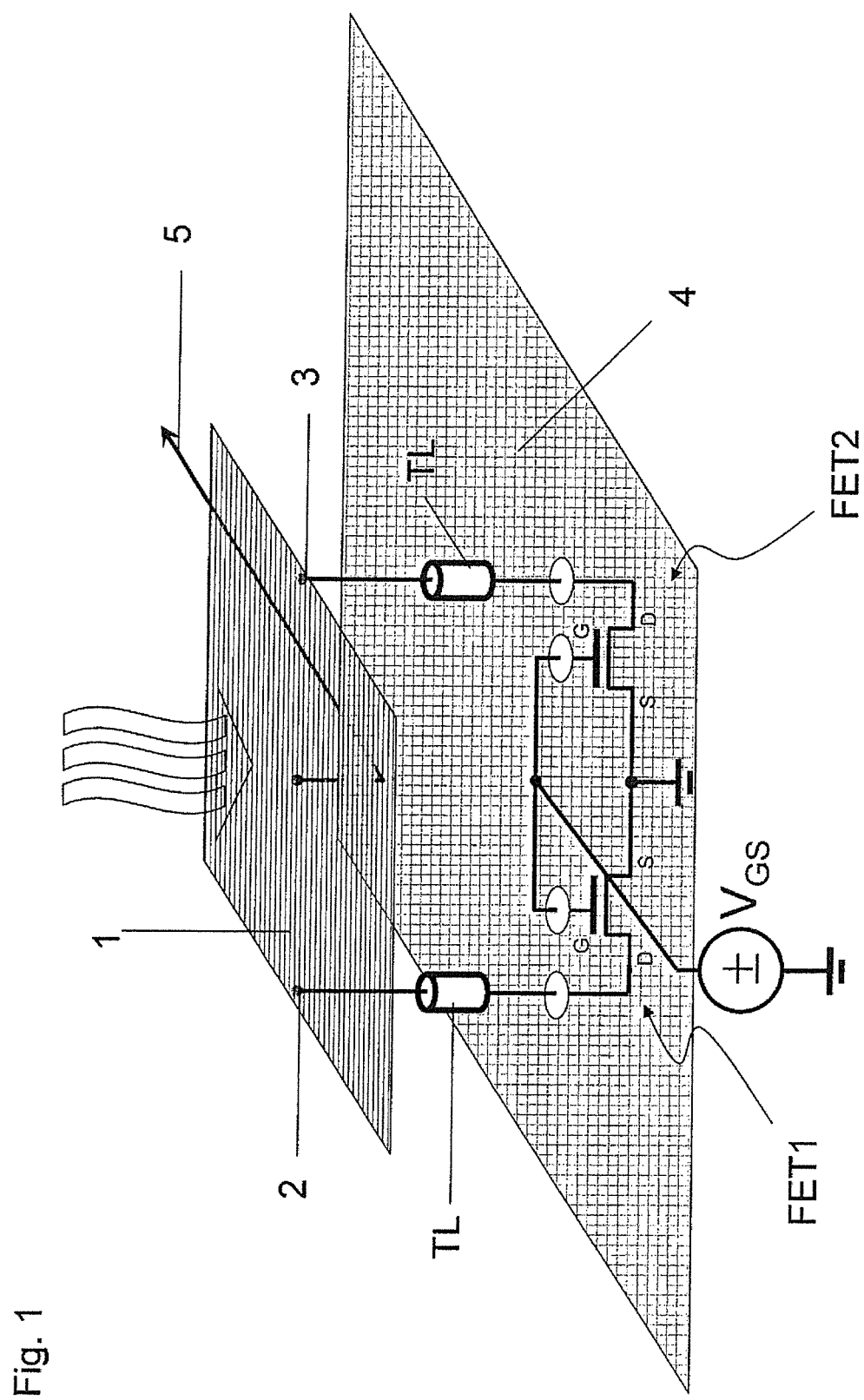
FIG. 1 shows an embodiment of the device according to the invention for detecting electromagnetic radiation in the THz frequency range
Figure 4:
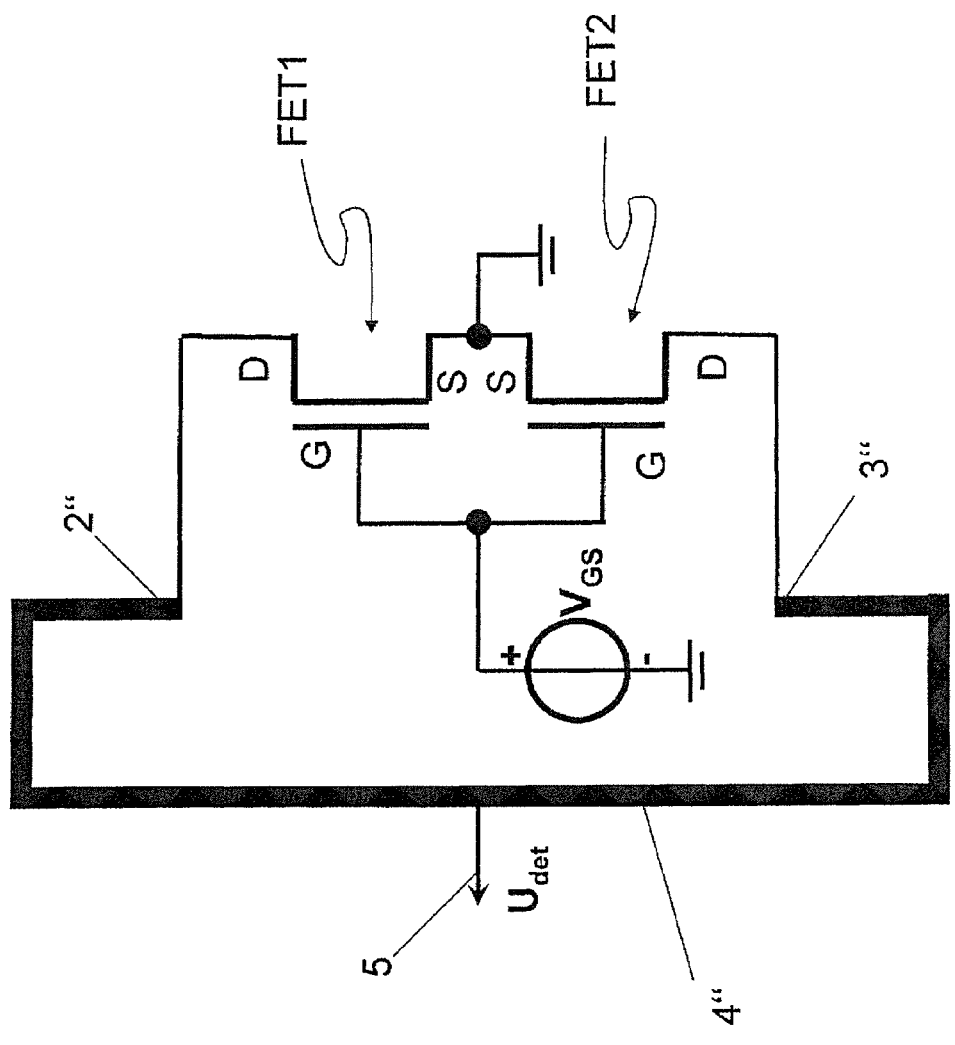

FIG. 4 schematically shows an embodiment such as that from FIG. 1.

Figure 5:
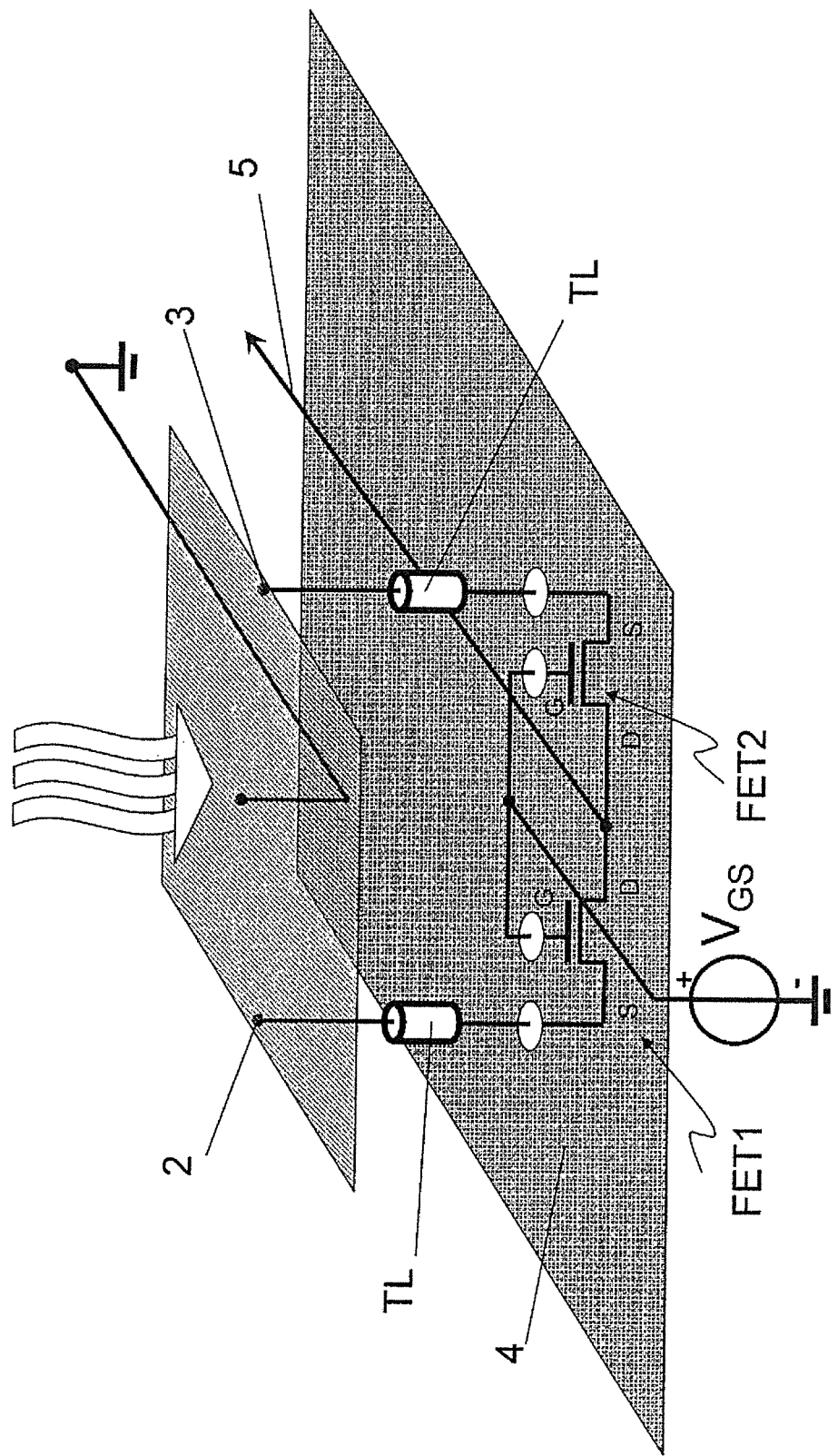

FIG. 5 shows an alternative embodiment of the device according to the invention with the source and drain transposed compared with the device from FIGS. 1 and 4.

Figure 6:
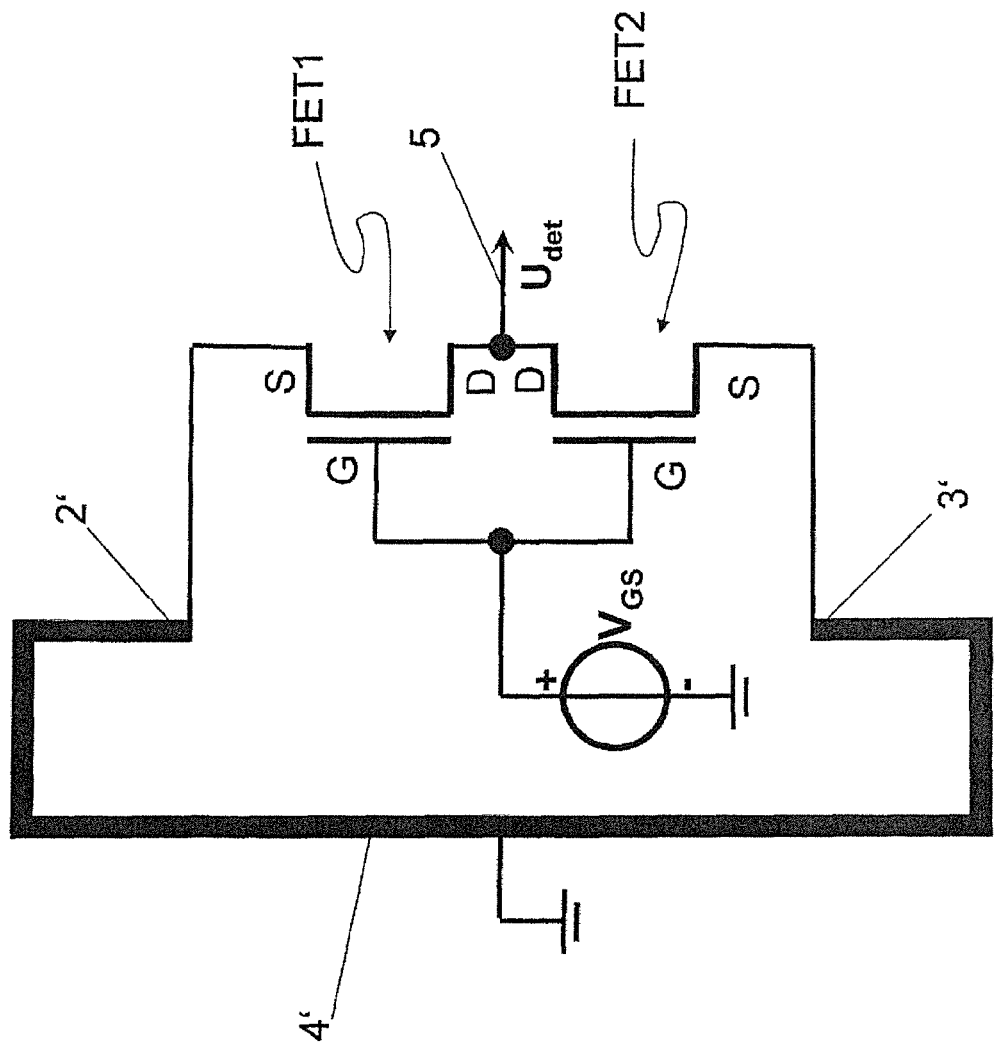

FIG. 6 schematically shows an embodiment such as that from FIG. 5.

Figure 7:
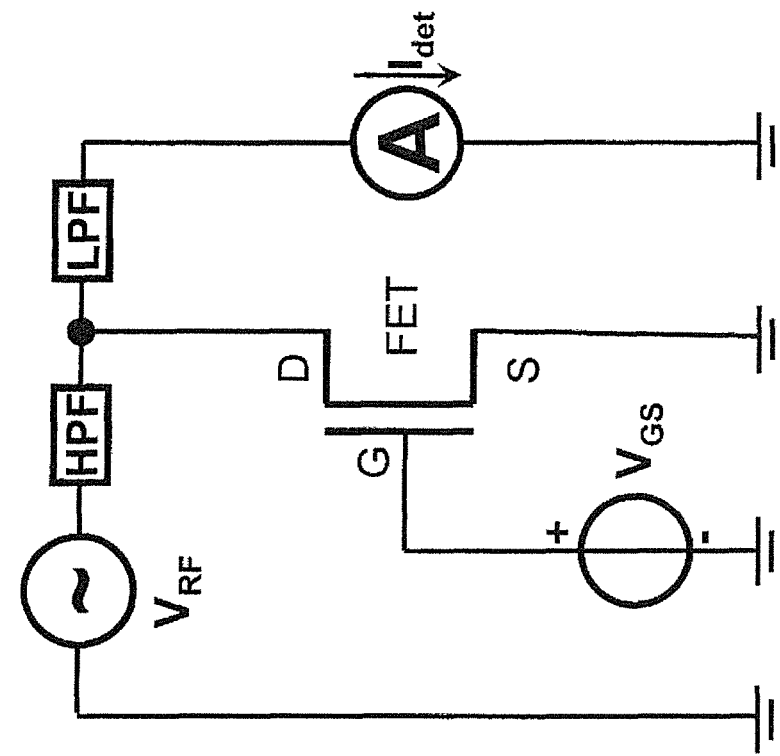

FIG. 7 schematically shows the wiring of a device according to the invention with voltage readout.

Figure 8:
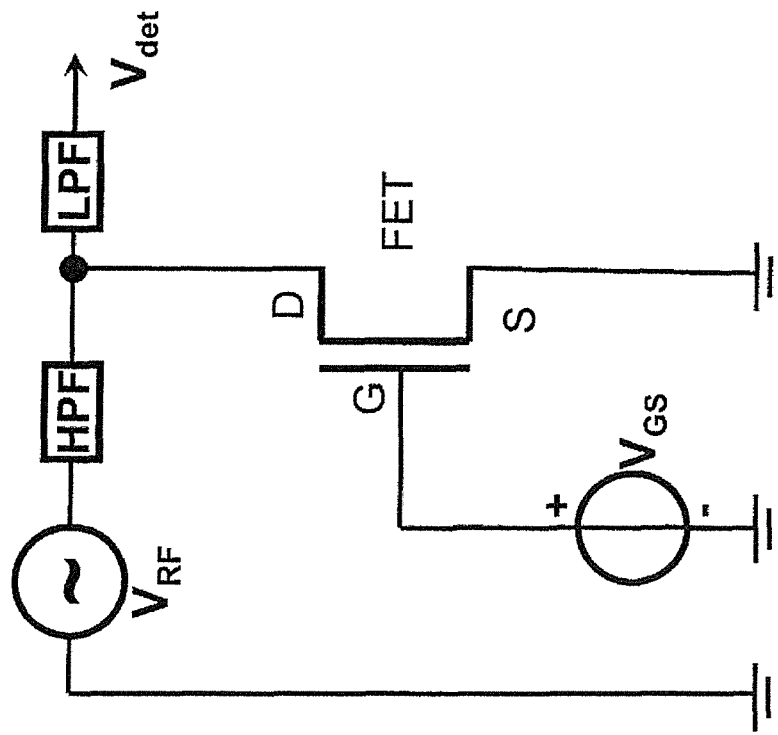

FIG. 8 schematically shows the wiring of a device according to the invention with current readout.

Figure 9:
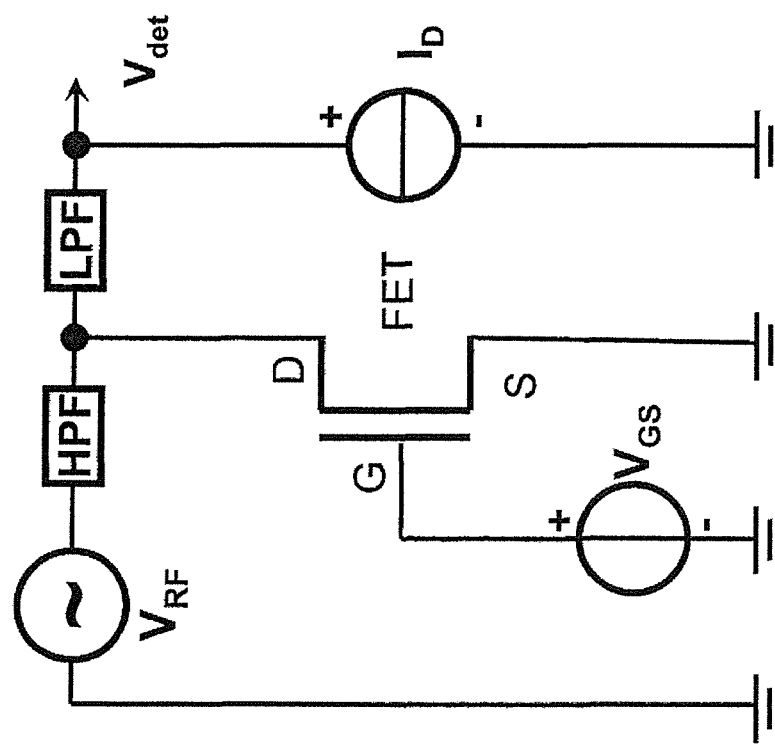

FIG. 9 shows an alternative embodiment of the circuit from FIG. 7.

Figure 10:
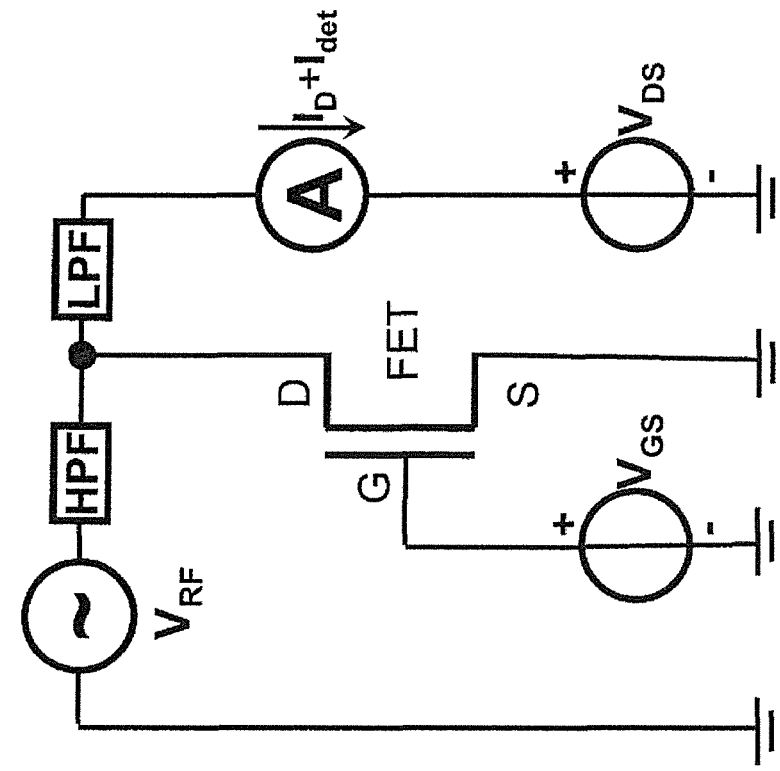

FIG. 10 shows an alternative embodiment of the circuit from FIG. 8.

Figure 11:
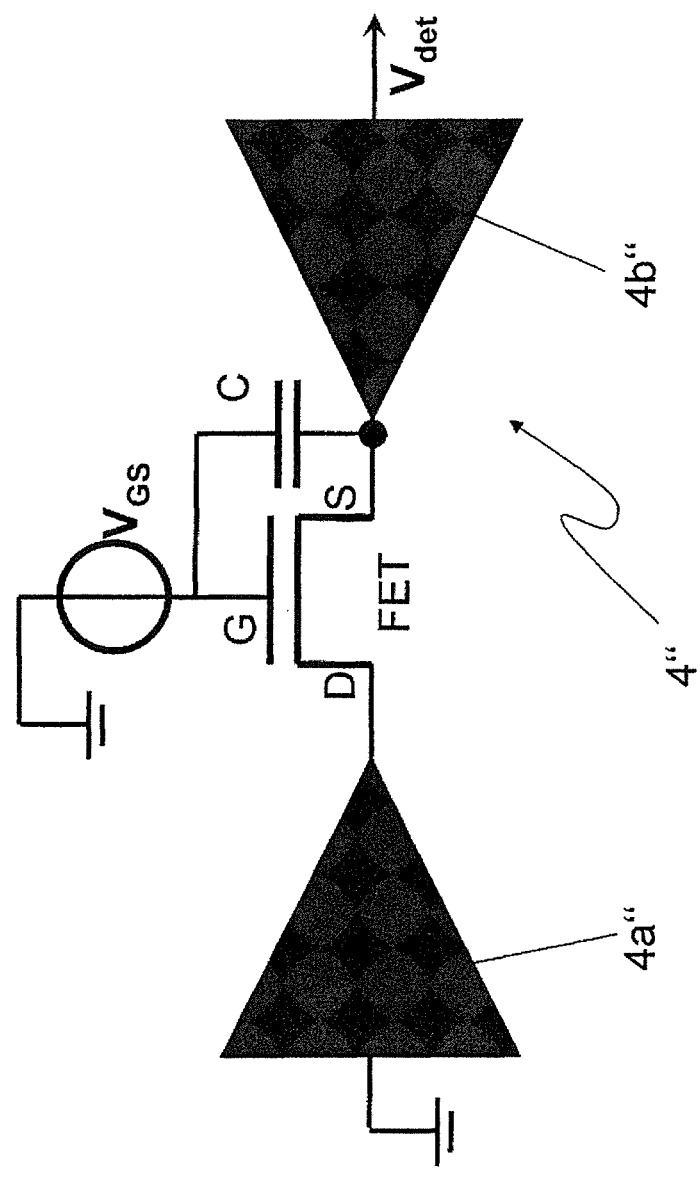

FIG. 11 schematically shows a further embodiment with a single transistor.

Figure 12:
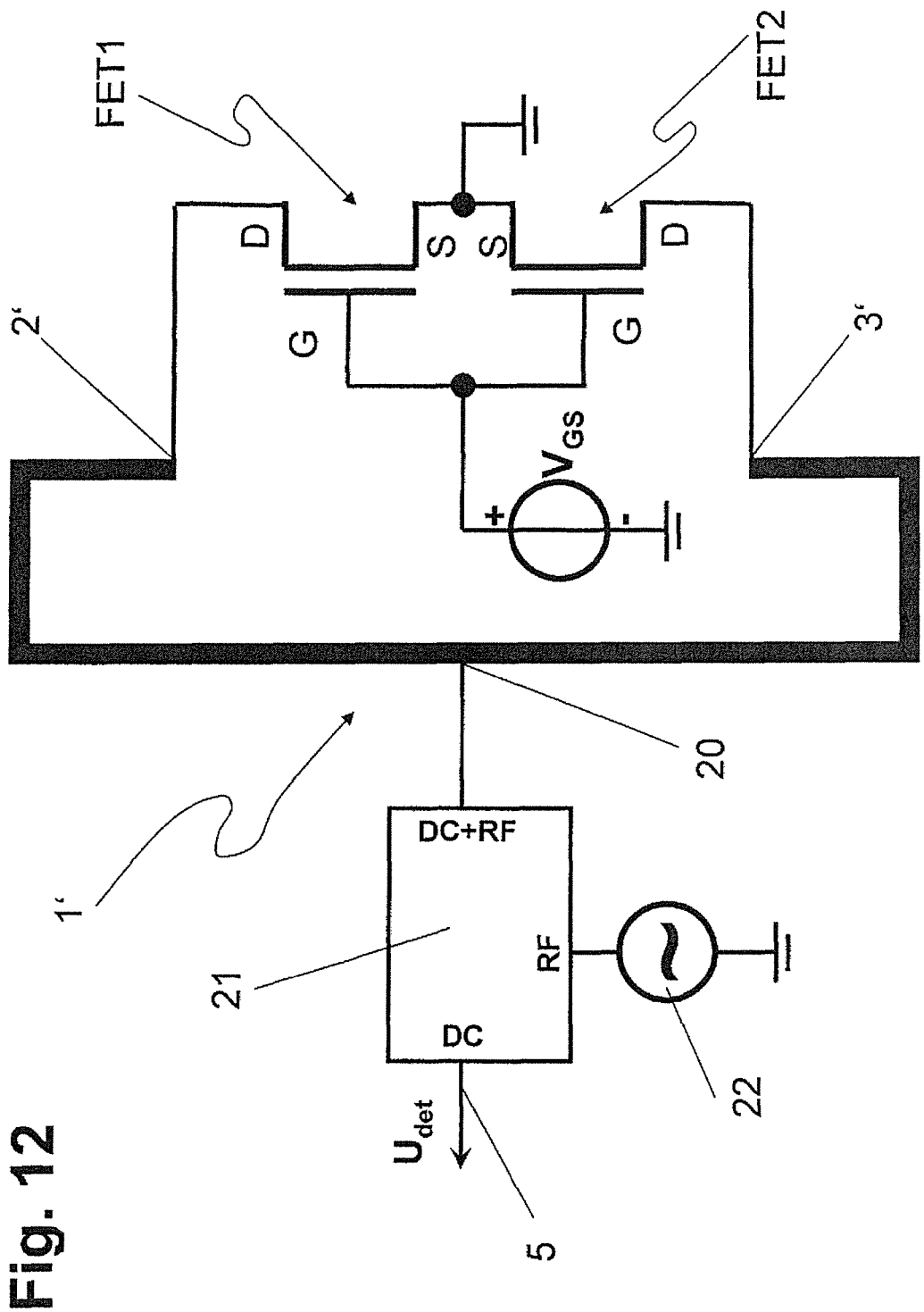

FIG. 12 schematically shows a variant of the embodiment from FIG. 4.

The device from FIG. 1 has two field effect transistors FET1, FET2. Each of the field effect transistors FET1, FET2 has a gate G, a drain D and a source S. An antenna structure 1, which is only shown schematically in FIG. 1, has a patch antenna. The two foot points 2, 3 of the patch antenna are each connected via transmission lines TL for the impedance matching with the drains D of the field effect transistors FET1, FET2.

The bias voltage of the gates G of the field effect transistors FET1, FET2 follows via a DC source $V_{GS}$, which is connected to the gates G of the field effect transistors FET1, FET2.

In the embodiment shown, all the components of the device, namely the antenna structure 1, the transmission lines TL and the two field effect transistors FET1, FET2, are integrated on a single chip.

The ground plane 4 of the patch antenna is arranged between the antenna structure 1 and the field effect transistors FET1, FET2. This also serves to shield the antenna structure 1 from the transistors. The antenna structure 1 is insulated against the ground plane 4 with a layer made of silicon oxide. The connections between the foot points 2, 3 of the antenna structure 1 and the drains D of the field effect transistors FET1, FET2 and the connections of the gates G of the field effect transistors FET1, FET2 and the bias voltage source $V_{GS}$ are guided through holes in the ground plane 4. In the embodiment of the detector circuit shown in FIG. 1, the two field effect transistors FET1, FET2 are used in differential wiring, wherein the sources S of the two transistors FET1, FET2 are connected to one another and form the first output of the circuit onto the ground plane 4. The drains are connected via the corresponding leads TL and the antenna structure 1 to the second output 5 of the circuit. The signal to be detected can be picked off by the evaluation circuits between the ground plane 4 and the output 5 of the circuit. In other words the signal to be detected is picked off via the antenna, wherein, due to the symmetry of the arrangement, the antenna takes over the function of a low-pass filter.

The gates G and the sources S of each of the transistors FET1 or FET2 are coupled to one another via an intrinsic capacitance. In this way, the voltage which is applied to the sources S directly follows the voltage which is applied to the gates G of the transistors FET1, FET2. In the embodiment shown, the two intrinsic capacitances each have a capacitance of 150 fF. This wiring makes it possible to operate the field effect transistors FET1, FET2 as a resistive mixer.

Figure 2:
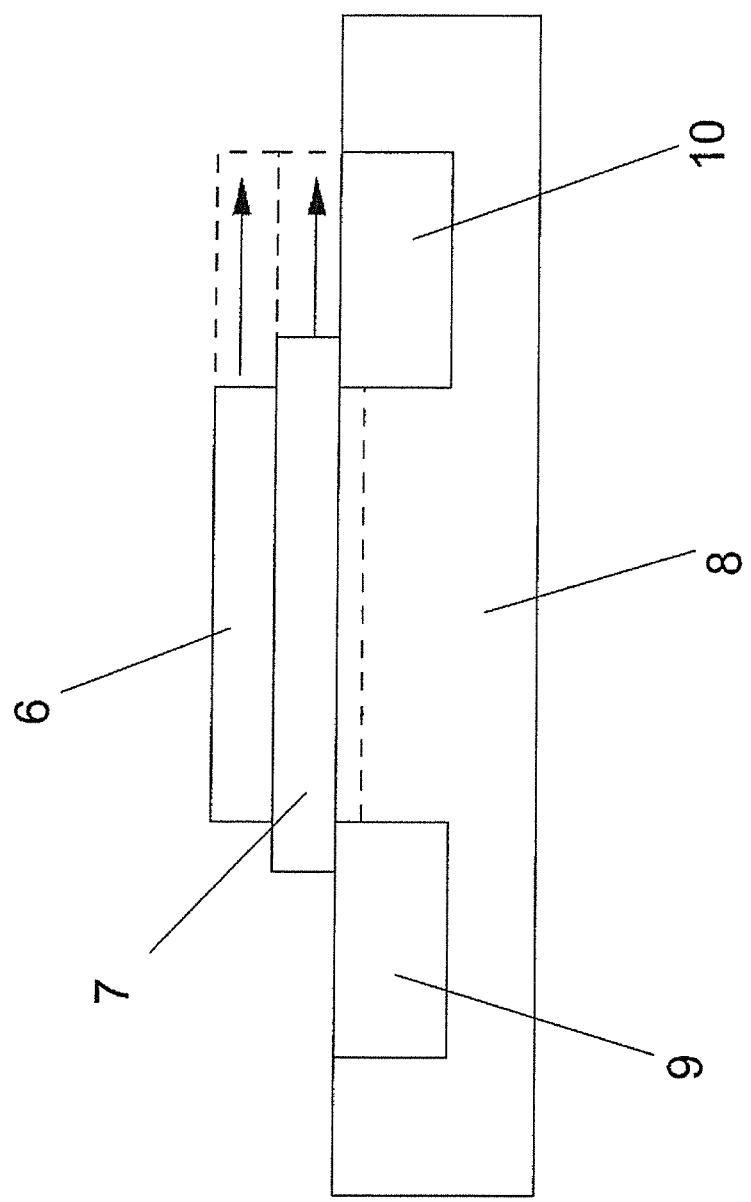
FIG. 2 shows a schematic sectional view through a MOSFET as used in embodiments of the invention.

In order to be able to adjust the intrinsic capacitances of the gate-source contact of each of the field effect transistors FET1, FET2, as shown schematically in FIG. 2, the gate contact 6 is insulated against the substrate 8 and the source contact 10 and the drain contact 9 by means of an oxide layer 7. Extending the gate contact 6 such that it extends over the source contact 10, as indicated in FIG. 2 by the dashed line and the arrow, makes it possible to increase the intrinsic capacitance of the gate-source contact, which significantly increases the degree of coupling of the voltages of gate G and source S.

FIG. 4 shows a schematic representation of a circuit from FIG. 1, wherein the drains D of the two field effect transistors FET1, FET2 are connected to the foot points 2", 3" of a folded dipole antenna 1'.

FIG. 12 shows a schematic representation of a circuit as a modification of the circuit from FIG. 4. As is the case with the circuit from FIG. 4, the circuit from FIG. 12 also has a folded dipole antenna 1'. The drains D of the two field effect transistors FET1, FET2 are connected to the foot points 2', 3' of the dipole antenna 1'.

The coupling of the THz signal into the source-drain channels of the field effect transistors FET1, FET2 according to the invention, i.e. a galvanic connection between the foot points 2', 3' with the drains D of the transistors FET1, FET2, makes it possible in the embodiments from FIGS. 4 and 12 to read out the output signal of the transistors FET1, FET2 via the antenna structure 1' itself. To this end, the antenna structure provides a further terminal in a virtual ground (20).

Due to its symmetry, the dipole antenna 1' has a virtual ground 20, at which the THz wave on the antenna has a temporally invariant node. At this point 20, the output signal of the transistors FET1, FET2 can be picked off without any disruptive influences of the actual THz signal. Due to its resonance for the THz radiation to be detected, the antenna structure 1' acts as a low-pass filter.

In the case of the circuit of FIG. 12, the point of symmetry 20 of the antenna structure 1' is connected via a bias tee 21 to a calibration source 22 for an electromagnetic signal. With the aid of the calibration source 22, an electromagnetic signal in the THz frequency range with a defined voltage can be generated and fed via the antenna structure 1' into the detector device.

In addition, the bias tee provides an output terminal 5 for picking off the output signal of the field effect transistors FET1, FET2. In this way, the output signal of the transistors FET1, FET2 can also be picked off via the point of symmetry 20 of the antenna structure.

Figure 3:
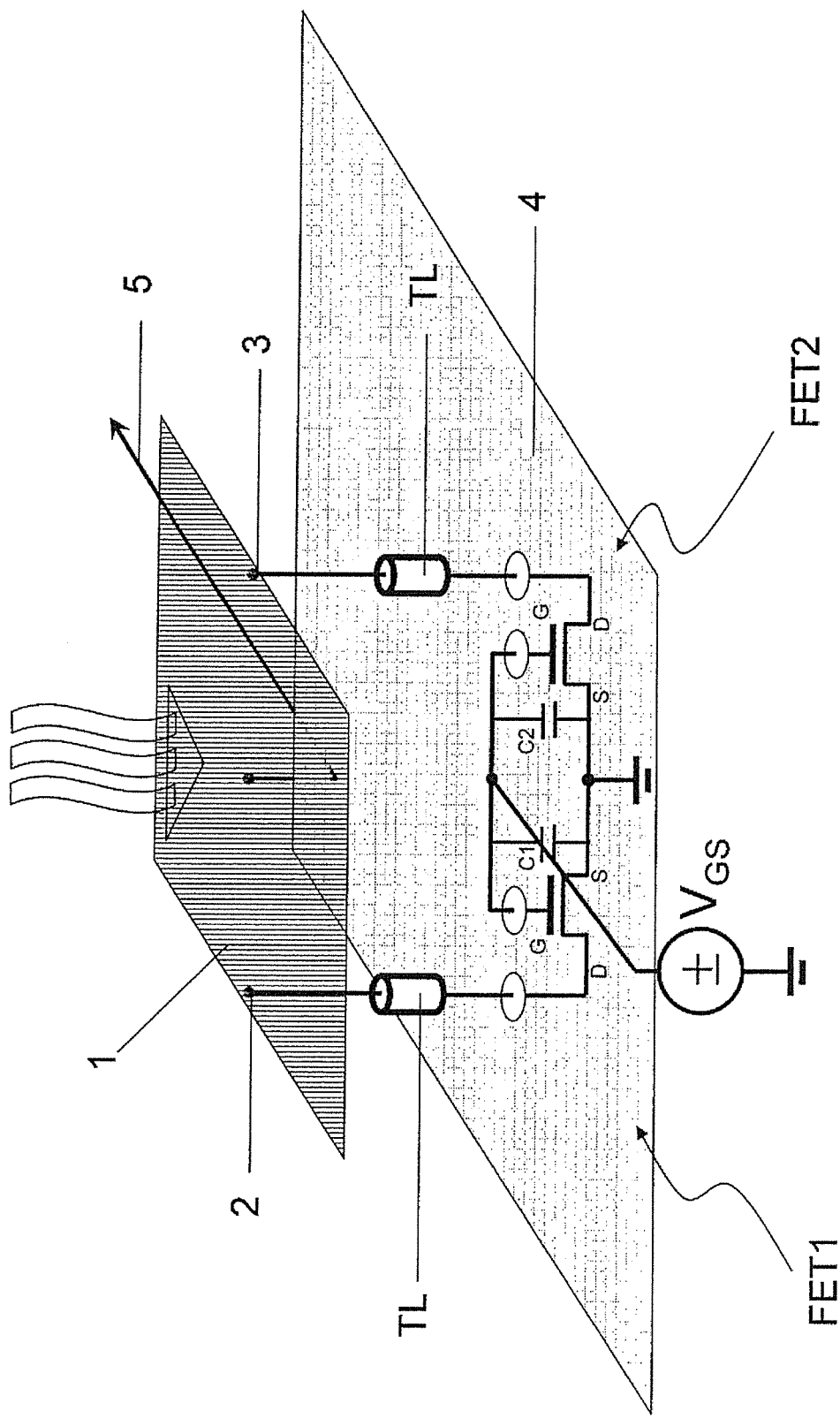
FIG. 3 shows a variant of the embodiment from FIG. 1.

FIG. 3 shows a variation of the embodiment of the device according to the invention of FIG. 1. Unlike the embodiment from FIG. 1, the circuit arrangement of FIG. 3 has additional capacitances C1, C2 between the gates G and sources S of each of the field effect transistors FET1, FET2. In addition to the intrinsic capacitances of the field effect transistors FET1, FET2, these external capacitances C1, C2 make it possible to set the capacitive coupling between the gates G and sources S exactly.

Alternatively to the embodiments from FIGS. 1, 3 and 4, FIGS. 5 and 6 show arrangements in which the sources S and drains D of the field effect transistors FET1, FET2 have been transposed. In other words the antennas 4, 4' and the foot points thereof 2, 2', 3, 3' are connected to the sources S of the field effect transistors FET1, FET2 instead of to the drains D. This transposition of the wiring is brought about in that the output of the signal to be detected is now connected to the drains D of the transistors FET1, FET2, while the antenna 4, 4' is connected to ground. While FIG. 5 again shows the implementation with a patch antenna 4, in FIG. 6 an implementation with a folded dipole antenna 4' is represented.

The previously shown embodiments all detect the readout signal as a voltage level as is represented in summary in FIG. 7. The high-frequency signal $V_{RF}$ is coupled into the drain D of the field effect transistor FET, wherein the drain is separated from the ground by a high-pass filter HPF. The signal to be detected is read out with a high-impedance measuring device as a voltage $V_{det}$.

However, as shown in FIG. 8, the signal to be detected can be read out just as well with a low-impedance measuring device as a current $I_{det}$.

FIGS. 9 and 10 show embodiments of the circuits of FIGS. 7 and 8, in which the amplifying property of the field effect transistors FET is used to amplify the voltage signal $V_{det}$ to be detected or the current signal $I_{det}$ to be detected. For this purpose, the circuit of FIG. 9 has an additional current source $I_D$ in the signal output or the circuit of FIG. 10 has an additional voltage source $V_{DS}$ in the signal output.

FIG. 11 shows a circuit according to the invention in which the field effect transistor FET is embedded in a bowtie antenna 4". One wing 4a" of the antenna 4" is connected to the drain D of the transistor FET, while the other wing 4b" the of antenna 4" is connected to the source S. The signal to be detected is picked off as a voltage $V_{det}$ via the wing 4b" of the antenna. In order to generate a detection signal, the symmetry of the arrangement must imperatively be broken with a capacitance, here an external capacitor C, between the source S and the gate G.

For the purposes of the original disclosure, reference is made to the fact that all the features derived by a person skilled in the art from the present description, the drawings and the claims, even if they were only described specifically in connection with particular further features, can be combined both individually and in any arrangements with other features or groups of features disclosed here, unless this has been expressly excluded or technical circumstances make such combinations impossible or pointless. For reasons of brevity and readability, here no comprehensive explicit representation of all conceivable combinations of features will be given.

While the invention has been presented and described in detail in the drawings and the preceding description, this description is by way of example only and is not intended to limit the scope of protection as defined by the claims. The invention is not limited to the embodiments disclosed.

Modifications of the disclosed embodiments are obvious for a person skilled in the art from the drawings, the description and the accompanying claims. In the claims, the word "have" does not exclude other elements or steps and the indefinite article "a" or "an" does not exclude the possibility of a plurality. The mere fact that particular features are claimed in different claims does not exclude the possibility of their combination. Reference numbers in the claims are not intended to limit the scope of protection.

The invention claimed is:

1. Device for detecting electromagnetic radiation in the THz frequency range from 100 GHz to 30 THz comprising:
    at least one field effect transistor (FET1, FET2), which has a drain (D) as first electrode, a source (S) as second electrode, a gate (G) as control electrode and a channel between the first electrode (D) and the second electrode (S); and
    an antenna structure (1),
    wherein the field effect transistor (FET1, FET2) and the antenna structure are arranged together on a single substrate,
    wherein the first electrode (D) of the field effect transistor (FET1, FET2) is connected in a directly electrically conductive manner to the antenna structure (1) by an uninterrupted electrical conductor to form a conductive connection between the first electrode (D) and the antenna structure (1) such that an electromagnetic signal in the THz frequency range from 100 GHz to 30 THz received by the antenna structure (1) can be fed into the channel between the first electrode (D) and the second electrode (S) of the field effect transistor (FET1, FET2) via the conductive connection between the first electrode (D) and the antenna structure (1), and
    wherein the device is configured in accordance with a configuration selected from the group consisting of:
    (i) the control electrode (G) is connected via an external capacitance (C1, C2) to the second electrode (S) such that no AC voltage drop occurs between the control electrode (G) and the second electrode (S);
    (ii) the control electrode (G) is not connected via an external capacitance to the second electrode (S), but the control electrode (G) and the second electrode (S) have an intrinsic capacitance such that no AC voltage drop occurs between the control electrode (G) and the second electrode (S); and
    (iii) the control electrode (G) is connected via an external capacitance (C1, C2) to the second electrode (S), and the control electrode (G) and the second electrode (S) have an intrinsic capacitance, such that no AC voltage drop occurs between the control electrode (G) and the second electrode (S).

2. Device according to claim 1, wherein the antenna structure (1) has a terminal (2, 3), which is connected in an electrically conductive manner to the first electrode (D).

3. Device according to claim 1, wherein it has two transistors (FET1, FET2).

4. Device according to claim 3, wherein the transistors (FET1, FET2) are connected in parallel, wherein the second electrodes (S) of the two transistors (FET1, FET2) are connected to one another in an electrically conductive manner.

5. Device according to claim 3, wherein the antenna structure (1) has two terminals (2, 3), which are each connected to the first electrode (D) of one the transistors (FET1, FET2) such that the transistors (FET1, FET2) can be differentially driven.

6. Device according to claim 1, wherein the first electrode (D) of the transistor (FET1, FET2) is connected both in an electrically conductive manner to the antenna structure (1') and in an electrically conductive manner to a further terminal (20), such that an electromagnetic signal in the THz frequency range received by the antenna structure (1') can be fed into the channel between the first electrode (D) and the second electrode (S) of the transistor (FET1, FET2) and, via the further terminal (20), an output signal (5) of the transistor (FET1, FET2) can be picked off, a further signal can be fed to the first electrode (D) of the transistor, or both.

7. Device according to claim 6, wherein the device has a calibration source (22) for an electromagnetic calibration signal, wherein the further terminal (20) is connected to the calibration source (22).

8. Device according to claim 6, wherein the further terminal (20) is connected to a bias tee (21), wherein the bias tee (21) provides an output terminal (5) for picking off the output signal of the field effect transistors (FET1, FET2) and wherein the bias tee (21) is connected to a calibration source (22) for an electromagnetic calibration signal.

9. Device according to claim 6, wherein the further terminal is connected to a point of symmetry of the antenna structure (1') or to a point (20) on an axis of symmetry of the antenna structure (1').

10. Device according to claim 1, wherein it has a ground plane (4) which is arranged between the antenna structure (1) and the transistor (FET1, FET2).

11. Device according to claim 1, wherein there is a capacitance between the control electrode and the second electrode (S) due to said external capacitance, said intrinsic capacitance, or a combination of said external capacitance and said intrinsic capacitance, wherein the capacitance between the control electrode and the second electrode (S) is greater than 0.1 fF.

12. Device according to claim 1, wherein the first electrode (D) of the transistor (FET1, FET2) is connected in an electrically conductive manner via an impedance matching element (TL1, TL2), preferably a waveguide, to the antenna structure (1).

13. THz heterodyne receiver with at least one device according to claim 1.

14. Imaging system with at least one device according to claim 1.

15. Device according to claim 1, wherein the control electrode (G) is connected to a DC source.

16. Device for detecting electromagnetic radiation in the THz frequency range from 100 GHz to 30 THz comprising:
    at least one field effect transistor (FET1, FET2), which has a drain (D) as first electrode, a source (S) as second electrode, a gate (G) as control electrode and a channel between the first electrode (D) and the second electrode (S); and
    an antenna structure (1),
    wherein the field effect transistor (FET1, FET2) and the antenna structure are arranged together on a single substrate, wherein the second electrode (S) of the field effect transistor (FET1, FET2) is connected in a directly electrically conductive manner to the antenna structure (1) by an uninterrupted electrical conductor to form a conductive connection between the second electrode (S) and the antenna structure (1) such that an electromagnetic signal in the THz frequency range from 100 GHz to 30 THz received by the antenna structure (1) can be fed into the channel between the first electrode (D) and the second electrode (S) of the field effect transistor (FET1, FET2) via the conductive connection between the second electrode (S) and the antenna structure (1), and Wherein the device is configured in accordance with a configuration selected from the group consisting of:

(i) the control electrode (G) is connected via an external capacitance (C1, C2) to the first electrode (D) such that no AC voltage drop occurs between the control electrode (G) and the first electrode (D);

(ii) the control electrode (G) is not connected via an external capacitance to the first electrode (D), but the control electrode (G) and the first electrode (D) have an intrinsic capacitance such that no AC voltage drop occurs between the control electrode (G) and the first electrode (D); and (iii) the control electrode (G) is connected via an external capacitance (C1, C2) to the first electrode (D), and the control electrode (G) and the first electrode (D) have an intrinsic capacitance, such that no AC voltage drop occurs between the control electrode (G) and the first electrode (D).

17. Device according to claim 16, wherein the antenna structure (1) has a terminal (2, 3), which is connected in an electrically conductive manner to the second electrode (S).

18. Device according to claim 16, wherein it has two transistors (FET1, FET2).

19. Device according to claim 18, wherein the transistors (FET1, FET2) are connected in parallel, wherein the first electrodes (D) of the two transistors (FET1, FET2) are connected to one another in an electrically conductive manner.

20. Device according to claim 18, wherein the antenna structure (1) has two terminals (2, 3), which are each connected to the second electrode (S) of one the transistors (FET1, FET2) such that the transistors (FET1, FET2) can be differentially driven.

21. Device according to claim 16, wherein the second electrode (S) of the transistor (FET1, FET2) is connected both in an electrically conductive manner to the antenna structure (1') and in an electrically conductive manner to a further terminal (20), such that an electromagnetic signal in the THz frequency range received by the antenna structure (1') can be fed into the channel between the first electrode (D) and the second electrode (S) of the transistor (FET1, FET2) and, via the further terminal (20), an output signal (5) of the transistor (FET1, FET2) can be picked off, a further signal can be fed to the second electrode (S) of the transistor, or both.

22. Device according to claim 21, wherein the device has a calibration source (22) for an electromagnetic calibration signal, wherein the further terminal (20) is connected to the calibration source (22).

23. Device according to claim 21, wherein the further terminal (20) is connected to a bias tee (21), wherein the bias tee (21) provides an output terminal (5) for picking off the output signal of the field effect transistors (FET1, FET2) and wherein the bias tee (21) is connected to a calibration source (22) for an electromagnetic calibration signal.

24. Device according to claim 21, wherein the further terminal is connected to a point of symmetry of the antenna structure (1') or to a point (20) on an axis of symmetry of the antenna structure (1').

25. Device according to claim 16, wherein it has a ground plane (4) which is arranged between the antenna structure (1) and the transistor (FET1, FET2).

26. Device according to claim 16, wherein there is a capacitance between the control electrode and the first electrode (D) due to said external capacitance, said intrinsic capacitance, or a combination of said external capacitance and said intrinsic capacitance, wherein the capacitance between the control electrode and the first electrode (D) is greater than 0.1 fF.

27. Device according to claim 16, wherein the second electrode (S) of the transistor (FET1, FET2) is connected in an electrically conductive manner via an impedance matching element (TL1, TL2), preferably a waveguide, to the antenna structure (1).

28. THz heterodyne receiver with at least one device according to claim 16.

29. Imaging system with at least one device according to claim 16.

30. Device according to claim 16, wherein the control electrode (G) is connected to a DC source.

* * * * *